United States Patent [19]

Choi et al.

[11] Patent Number: 5,104,821

[45] Date of Patent: Apr. 14, 1992

[54] METHOD FOR FABRICATING STACKED CAPACITORS IN A DRAM CELL

[75] Inventors: Jin-Suk Choi; Kyoung-Ha Son, both of Suwon; Yong-Chul Ahn, Ahnyang, all of Rep. of Korea

[73] Assignee: SamSung Electronics Co., Ltd., Suwon, Rep. of Korea

[21] Appl. No.: 560,755

[22] Filed: Jul. 31, 1990

[30] Foreign Application Priority Data

Jun. 21, 1990 [KR] Rep. of Korea ............... 1990-9188

[51] Int. Cl.[5] ........................................... H01L 21/70
[52] U.S. Cl. ..................................... 437/52; 437/47; 437/48; 437/60; 437/228; 437/233; 437/918
[58] Field of Search ................. 437/40, 41, 47, 51, 437/52, 60, 191, 193, 200, 203, 228, 233, 235, 919; 357/23.6, 51

[56] References Cited

U.S. PATENT DOCUMENTS 4,882,289  1/1989  Moriuchi et al. .................. 437/60

OTHER PUBLICATIONS

Watanabe et al., "Stacked capacitor cells for High-density DRAMS" IEDm 1988, pp. 600-603.

Primary Examiner—Brian E. Hearn
Assistant Examiner—Tom Thomas
Attorney, Agent, or Firm—Robert E. Bushnell

[57] ABSTRACT

A method for fabricating a capacitor in a substrate on which there is prepared a field oxide layer, a gate electrode, a source region, a drain region and an insulation layer, includes the sequential processes of: etching a first mask pattern formed on a portion of a first conductive layer in contact with the source region; forming sequentially a first illustration layer and a second conductive layer on a surface of the first conductive layer; forming on a second conductive layer a second mask pattern having a reverse phase of the first mask pattern; etching the second conductive layer disposed on a portion of the first conductive layer; etching the oxidized second conductive layer disposed on an upper surface of the first insulation layer in a high pressure diffusion furnace; etching anistrophically the first insulation layer by using the oxidated second conductive layer as a mask; forming a pattern for an underlying electrode by etching anistrophically the first conductive layer to a predetermined thickness; removing the oxidated second conductive layer and said first insulation layer, sequentially; and forming a second insulation layer on the surface of the underlying electrode and covering a third conductive layer over the substrate so as to form an upperlying electrode.

20 Claims, 5 Drawing Sheets

METHOD FOR FABRICATING STACKED CAPACITORS IN A DRAM CELL

BACKGROUND OF THE INVENTION

This invention relates generally to fabrication of capacitors in a DRAM cell and, more particularly, to a method and process for fabricating stacked-capacitors with a large capacitance.

A DRAM cell is in general a semiconductor memory device with one transistor and one capacitor, in which data of 1-bit can be stored in the capacitor by the charge stored therein. As a tendency to higher density of an integrated semiconductor device causes the density of the DRAM cells to be increased, the area occupied by one memory cell becomes gradually decreased. Therefore, the present invention is devoted to the manufacture of a capacitor with a maximum capacity in a limited area.

Figure 1A:
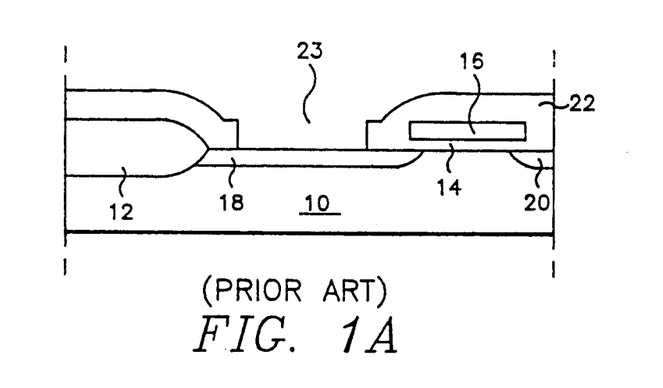
FIGS. 1A-1C illustrate a fabrication process of a DRAM cell according to the conventional method.
Figure 1B:
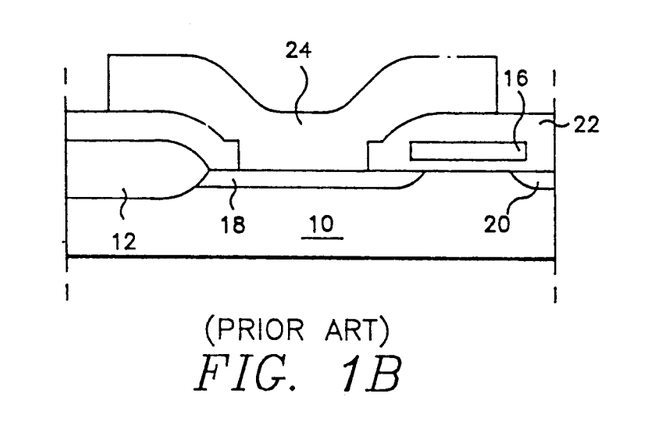
Figure 1C:
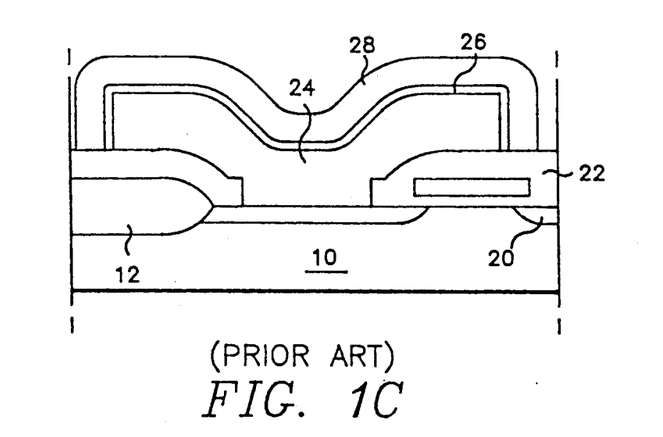

FIGS. 1A-1C represent known fabrication processes of a stacked-capacitor according to the conventional method. In FIG. 1A, a field oxide layer 12 for the separation of respective cells is formed in a portion of a substrate 10 of a first conductivity. Then, in order to prepare a source region 18, a layer of second conductivity is formed by an ion injection near the field oxide layer 12. A drain region 20 separately distanced from the field oxide layer 12 is formed. A first oxide layer 22 covers the entire surface of the substrate 10 except some parts of the source region 18. Between the source and drain regions 18, 20, a gate electrode 16 is formed thereon, while a gate oxide layer 14 is provided as an intermediate layer. Thereafter, a source contact region 23 is formed by etching the first oxide layer 22 on the source region 18, in a manner of a conventional etching process.

In FIG. 1B, after formation of a first polycrystalline silicon layer over the source region 18, a storage electrode 24 is formed by etching the predetermined region of the first polycrystalline layer.

In FIG. 1C, the stacked-capacitor having a typical stacked structure is completely fabricated by forming a plate electrode 28 along the top surface of a dielectric layer 26 by etching a predetermined region after spreading the dielectric layer 26 on the surface of the storage electrode 24 and by forming a second polycrystalline silicon layer over the entire surface of the substrate 10. In a conventional stacked-capacitor as shown in FIG. 1C, when the area occupied by a cell is reduced, the areas occupied by the storage electrode 24 and the plate electrode 28 are also reduced. Therefore, there is a problem in that the sufficient capacity required in a high density semiconductor memory device of more than 64 Mega bits cannot be secured. Therefore, as a way of increasing the capacity of the capacitors, the cylindrically structured stacked-capacitor is proposed.

FIGS. 2A-2F show the fabrication method of the cylindrical structure stacked-capacitor by using an alternative method.

Figure 2A:
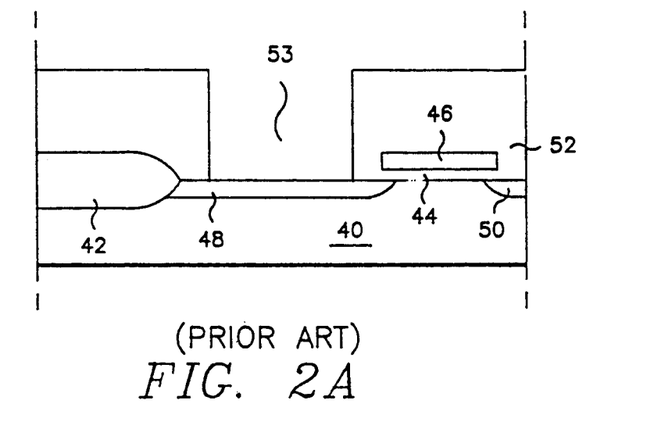
FIGS. 2A-2E illustrate another fabrication process of a DRAM cell according to the conventional method.

In the drawings, in order to separate the cells, the field oxide layer 42 is formed on one end of the substrate 40 of a first conductivity. An ion-injection of a second conductivity is made so as to prepare a source region 48 in contact with the field oxide layer 42. Separately distanced from the source region 48, a drain region 50 is formed. A first oxide layer is formed over the entire surface of the substrate 40 on which a gate electrode 46 is formed making a gate oxide layer 44 for an intermediate layer, the gate oxide layer 44 being positioned on and between the source and drain regions 48, 50, and thereafter a source contact region 53 is formed by etching the first oxide layer on the top surface of the source region 48. In this case, the first insulation layer 52 is the HTO (high temperature oxide) layer with a thickness of more than 9,000 Å.

Figure 2B:
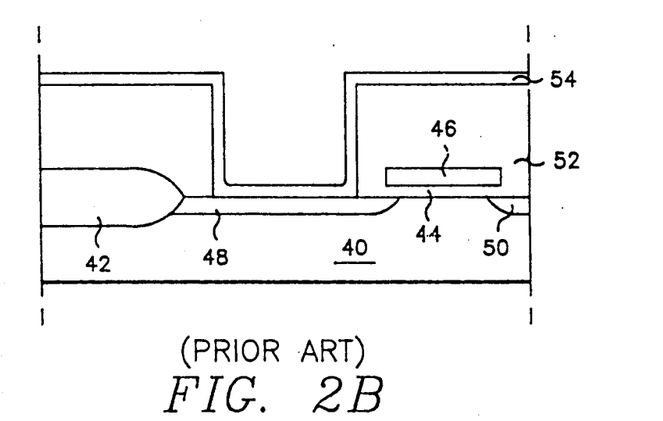
Figure 2C:
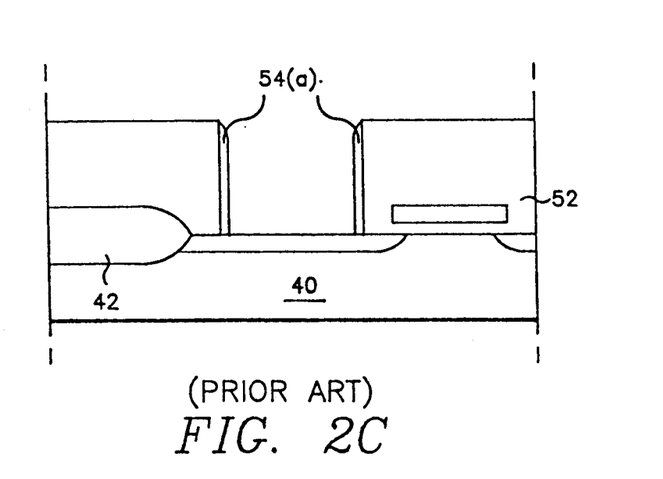
Figure 2D:
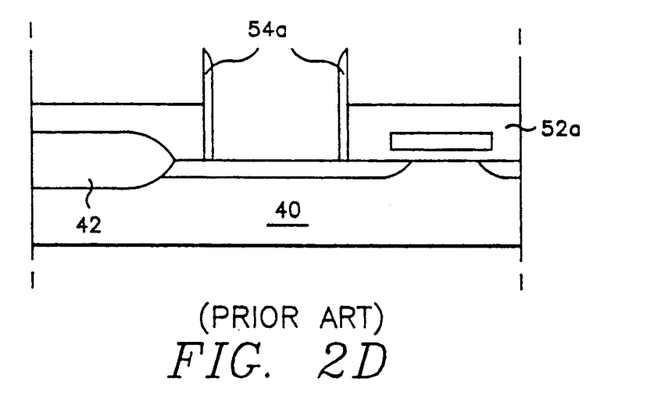
Figure 2E:
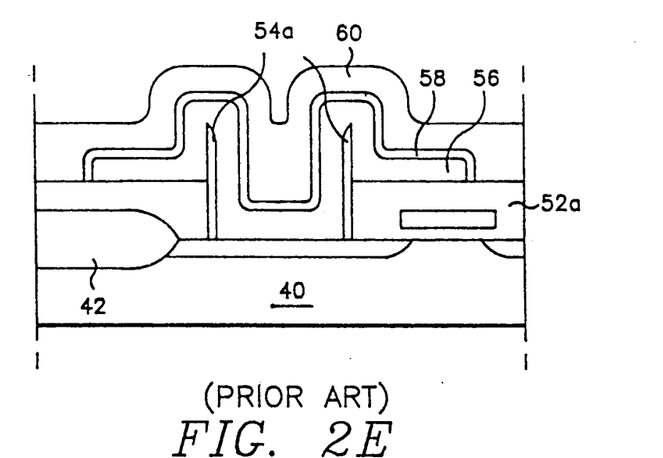

The nitride layer 54 with a thickness of 1,500 Å is then deposited using the conventional LPCVD (low pressure chemical vapor deposition) technique on the surface of the first insulation layer 52, as shown in FIG. 2B. Then, the side walls 54a of the nitride layer are formed on both sides of the first insulation layer 52 by using dried-etching, as shown in FIG. 2C. In FIG. 2D, as a result of the so-called Etch-Back in either dried-etching or damped-etching technique, the first insulation layer 52a etched in the above method is deposited in an approximate thickness of 3,000 Å. Then, the cylindrical structured capacitor is completely made by forming sequentially the first polycrystalline silicon layer 56 in contact with the source region 48, dielectric compound layer 58 made of both the oxide layer and the nitride layer, and the second polycrystalline silicon layer 60.

The first and second polycrystalline silicon layers 56, 60 are deposited by using the conventional LPCVD technique, and the thickness of the dielectric 58 is between 50 to 60 Å. A problem associated with this is that the fabrication process may be difficult, even though the capacity of the capacitor is increased more than the conventional stacked-capacitor.

Furthermore, as the difference between the cylindrical side walls 54a of the nitride layer is so wide, the subsequent process can be troublesome because of the bad step coverage.

On the other hand, in the conventional stacked-capacitor, the thickness of the storage electrode is limited to a certain thickness because of the limitation of the photographic technique. That is, there was a problem in that the bathtub-shaped capacitor required a more delicate pattern than that of the lower part polycrystalline silicon, because the limited photographic technique is applied during the formation of the underlying polycrystalline silicon layer in case of the manufacture of 64 Mega-bit DRAM.

SUMMARY OF THE INVENTION

Therefore, it is an object of the present invention to provide a fabrication method for capacitors having high-capacities.

It is another object of the present invention to provide a fabrication method for a capacitor which can be easily fabricated and has a high quality of step coverage.

It is still another object of the present invention to provide a fabrication method for a capacitor which can overcome the limitations of photographic technique.

According to an aspect of the present invention, a method of fabricating a capacitor in a substrate on which there is prepared a field oxide layer, a gate electrode, a source region, a drain region and an insulation layer, includes the sequential processes of:

etching a first mask pattern formed on a portion of a first conductive layer in contact with the source region;

forming sequentially a first insulation layer and a second conductive layer on a surface of the first conductive layer;

forming on the second conductive layer a second mask pattern having a reverse phase of the first mask pattern;

etching the second conductive layer disposed on a portion of the first conductive layer;

oxidating the etched second conductive layer disposed on an upper surface of the first insulation layer in a high pressure diffusion surface;

etching anistrophically the first insulation layer by using the oxidated second conductive layer as a mask;

forming a pattern of an underlying electrode by etching anistrophically the first conductive layer to a predetermined thickness;

removing the oxidated second conductive layer and said first insulation layer, sequentially; and forming a second insulation layer on the surface of the underlying electrode and covering a third conductive layer over the substrate so as to form an upperlying electrode.

BRIEF DESCRIPTION OF THE DRAWINGS

For a better understanding of the present invention and to show how the same may be carried into effect, reference will now be made, by way of example, to the accompanying diagrammatic drawings, in which.

DETAILED DESCRIPTION OF THE PREFERRED EMBODIMENTS

Figure 3:
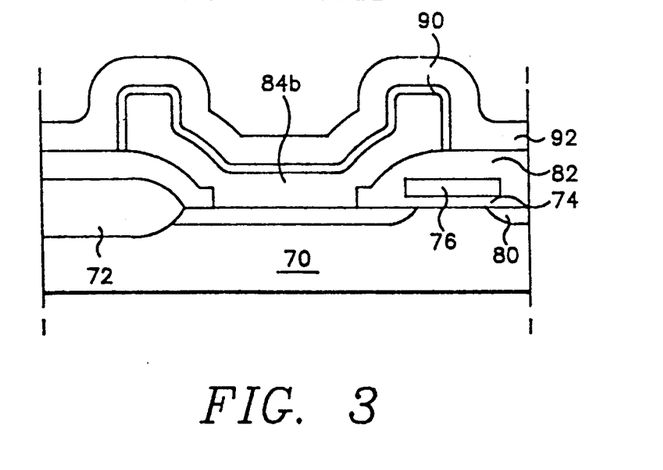
FIG. 3 is a cross sectional view of a DRAM cell according to the present invention.

Referring to FIG. 3, there is shown a cross sectional view of a DRAM cell having a bathtub-shaped capacitor, in which the DRAM cell includes a field oxide layer 72, a source region 78, a drain region 80, a gate oxide layer 74, a gate electrode 76, an underlying electrode 84b, a first insulation layer 90 and an upperlying electrode 92. The underlying electrode 84b has a bathtub-shaped structure which has upwardly extended edges.

Figure 4A:
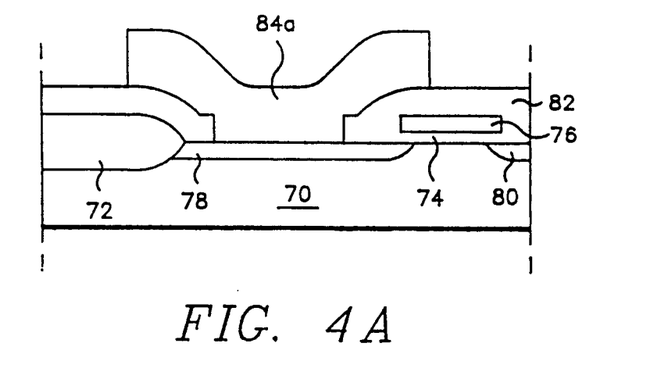
FIGS. 4A-4F illustrate a fabrication process of a DRAM cell according to the present invention.

FIGS. 4A to 4F represent fabrication processes according to the present invention. Referring to FIG. 4A, a first polysilicon is patterned to form an underlying electrode of the capacitor. A field oxide layer 72 is formed on a part of the substrate 70 in order to separate the respective cells while the gate oxide layer 74 is formed on the front side of the substrate 70. A gate electrode 76 is formed on the gate oxide layer 74. After the source and drain regions 78, 80 are formed by doping impurities in the conductive area of the substrate 70, the insulating layer 82 is grown on the whole surface of the substrate 70.

The source contact region is then formed by etching the insulation layer 82 positioned on the source region 78. With the known LPCVD technique, a first polycrystalline layer of approximately 4,000 Å thickness, is deposited on the surface of the insulation layer 82 and the source contact region. And then, a pattern of the polycrystalline silicon layer 84a is formed using a known photographic technique.

Figure 4B:
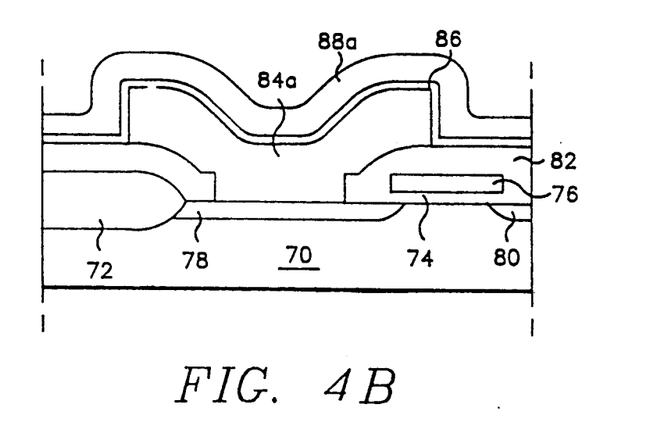

FIG. 4B illustrates a process of forming a nitride layer and a second polycrystalline silicon layer. The nitride layer is grown on the surface of the first polycrystalline silicon layer 84a of 500 Å thickness, at a temperature of 8,000° C. with gases of SiH$_2$Cl$_2$ and NH$_3$ in a manner of the LPCVD technique. On the whole surface of the substrate 70, the second polycrystalline silicon layer 88a, approximately 1,000 Å thickness, is deposited at temperature of 626° C. by using the known LPCVD technique.

Figure 4C:
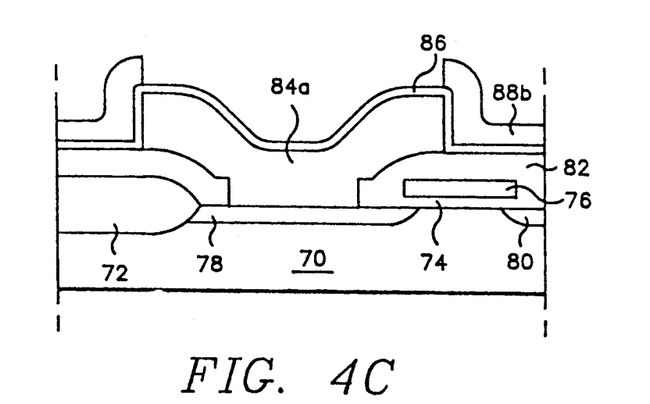

FIG. 4C shows a process of etching the second polycrystalline silicon layer 88a. The process includes forming a second mask pattern having a phase which is the reverse of the phase of the first mask pattern used in patterning the first polycrystalline silicon layer 84a, and thereby forming the second polycrystalline layer 88b by an anisotropic etching at the middle of the first polycrystalline layer other than the edges of the first polycrystalline silicon layer.

Figure 4D:
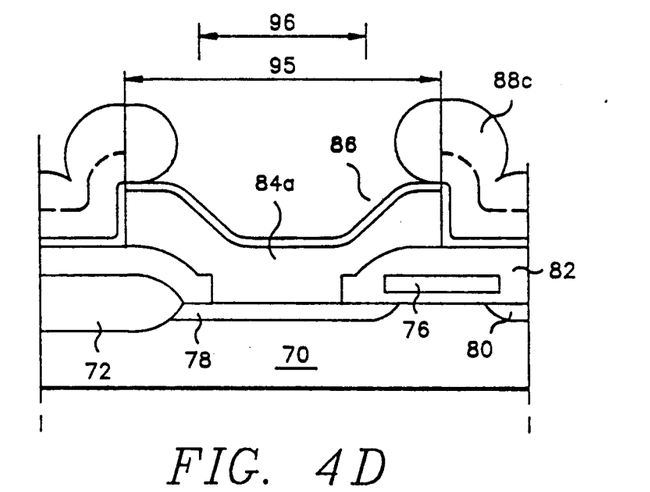

Referring to FIG. 4D, a process of heat oxidating the etched polycrystalline silicon layer 88b is shown. In a high pressure oxidation diffusion furnace, the polycrystalline silicon layer 88b is oxidated for 30 minutes at 850° C. and twenty-five atmospheres of atmospheric pressure. The nitride layer 86 prevents the first polycrystalline silicon layer 84a from oxidized.

As a result of the oxidation process, the second polycrystalline silicon layer 88b is changed into a silicon oxide layer, which brings about the volume expansion thereof. The volume expansion rate is about 12% more of a thickness than the second polycrystalline silicon layer 88b. That is, the thickness of the second polycrystalline silicone layer 88b is 1,000 Å before the oxidation, and 2,000 Å after the oxidation. A line of the first polycrystalline silicone layer 84a patterned by the best photographic technique is of a 3,500 Å thickness, while a line of the second polycrystalline silicon layer 88c made after the oxidation has a work thickness of 1500 Å. However, the linewidth 96 of the oxidated second polycrystalline silicone layer 88c is varied with the thickness of the second polycrystalline silicone layer 88a.

Figure 4E:
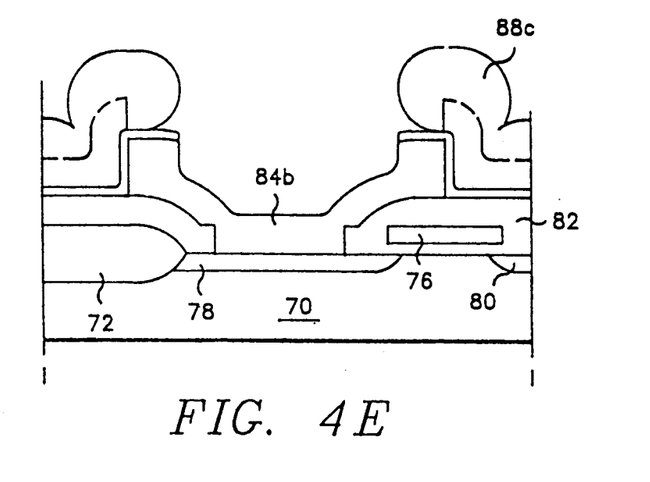

FIG. 4E represents a process of etching the first polycrystalline silicone layer 84a to form a bathtub-shaped structured silicon layer. The first polycrystalline silicone layer 84a and the nitride layer 86 are sequentially etched in a self-aligned mode by using the oxidized second polycrystalline silicone layer as a mask without a special mask. The first polycrystalline silicon layer resulting from etching is of an approximate thickness of 1,000 Å.

Figure 4F:
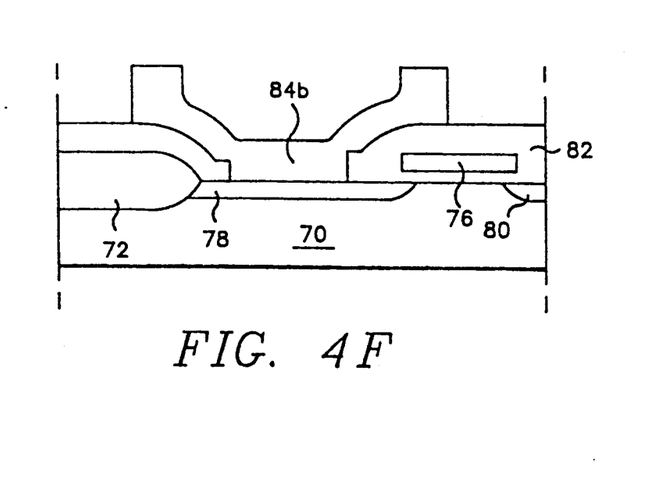

Referring to FIG. 4F, an underlying electrode is shown. The first polycrystalline silicon layer 84c is formed by removing the oxidized second polycrystalline silicone layer 88c and the nitride layer 86 sequentially, the oxidized polycrystalline silicone layer 88c being used for a mask. The underlying electrode 84b is then formed by being doped with impurities so that the first polycrystalline silicone layer 84b may be conductive, and is coated with the first insulation layer 90. The bathtub-shaped capacitor is accomplished by forming the upperlying electrode 92 which is formed by coating the second polycrystalline silicone layer 92 with the first insulation layer 90 and doping the layers with impurities so that the upperlying electrode 92 may be conductive.

In the foregoing description of the embodiment of the present invention, as shown in FIG. 4F, the first step to process is etching the first polycrystalline silicone layer 84b, and the second step is doping the layer with impurities in order to form the underlying electrode 84b. However, in another embodiment, the step of doping the layer with impurities can be carried out instantly after the step of depositing the first polycrystalline silicone layer, but not through the step of etching.

Furthermore, in the embodiment of the present invention, as shown in FIG. 4D, although a heat oxidation operation is carried out in a high pressure diffusion furnace, it is also carried out in the common diffusion furnace in another embodiment of the present invention. Oxidation operation is carried out for 10 hours at 950–1,000° C. atmospheric pressure in the common diffusion furnace.

In the embodiment of the present invention, the process of depositing the nitride layer 86 and the second polycrystalline silicone layer 88a over each side of the first polycrystalline silicone layer 84a is followed by the process of FIG. 4C. However, in another embodiment of the present invention, after depositing the nitride layer 86 and the second polycrystalline silicone layer 88a, the first nitride layer can be deposited over the second polycrystalline silicone layer 88a. And then, the process as shown in FIG. 4C is performed, etching the first nitride layer together. In the oxidation step, because the second polycrystalline silicon layer covered with the first nitride layer is not upwardly expanded but laterally expanded, the required size of the pattern of the bathtub shape is obtained.

According to still another embodiment of the present invention, the nitride layer 86 is substituted for a field oxide layer.

As described hereinabove, in the present fabrication method of the capacitor in a DRAM cell, the bathtub-shaped stacked-capacitor is obtained, having a still greater capacity than the conventional capacity. Furthermore, two advantages of the present invention are that the capacitor is readily fabricated and that the step coverage is excellent.

Moreover, the present invention can overcome the limitation of the conventional photographic technique by using the characteristics of volume expansion due to oxidation of the polycrystalline silicone layer.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A method of fabricating a capacitor in a substrate having a field oxide layer, a gate electrode, a source region, a drain region and an initial insulation layer, comprising the sequential processes of:
    etching a first mask pattern formed on a portion of a first conductive layer in contact with said source region;
    forming sequentially a first insulation layer and a second conductive layer on a surface of said first conductive layer;
    forming on said second conductive layer a second mask pattern having a reverse phase of said first mask pattern;
    etching said second conductive layer disposed on a portion of said first conductive layer;
    oxidizing the etched second conductive layer disposed on an upper surface of said first insulation layer in a high pressure diffusion furnace;
    etching anistrophically said first insulation layer by using said oxidized second conductive layer as a mask;
    forming a pattern for an underlying electrode by etching anistrophically said first conductive layer to a predetermined thickness;
    removing said oxidized second conductive layer and said first insulation layer, sequentially; and
    forming a second insulation layer on the surface of said underlying electrode and covering a third conductive layer over said substrate so as to form an upperlying electrode.

2. The method of claim 1, wherein said first, second and third conductive layers are polycrystalline silicon layers, said layers being doped with conductive impurities.

3. The method of claim 1, wherein said first and second insulation layers are layers of nitride.

4. The method of claim 1, wherein said etched second conductive layer is oxidized in a high pressure diffusion furnace for 30 minutes at a temperature of 850° C. in a pressure of approximately twenty-five atmospheres.

5. The method of claim 1, wherein said etched second conductive layer is oxidized in a diffusion furnace.

6. The method of claim 5, wherein said etched second layer is oxidated for a plurality of hours at 950° C. to 1,000° C. in an atmospheric pressure when an oxidation operation is carried out in the diffusion furnace.

7. The method of claim 1, wherein the thickness of said first conductive layer is approximately 4,000 Å.

8. The method of claim 7, wherein the thickness of said underlying electrode is approximately 1,000 Å.

9. The method of claim 1, wherein said etching process further comprises a process of forming a field oxide layer.

10. The method of claim 9, wherein said field oxide layer is a high temperature oxide layer.

11. A method of fabricating a capacitor in a substrate having a field oxide layer, a gate electrode, a source region, a drain region and an insulation layer, comprising the sequential processes of:
    forming a first mask pattern on a first conductive layer in contact with said source region and implementing an etching operation;
    sequentially depositing a field oxide layer, a polycrystalline silicon layer and a nitride layer on a surface of said first conductive layer;
    forming a second mask pattern on said polycrystalline silicon and nitride layers, the phase of said second mask pattern being in reverse of the phase of said first mask pattern;
    etching both said polycrystalline silicon layer and nitride layer on a surface of said first conductive layer;
    oxidizing the etched second conductive layer in a high pressure diffusion furnace;
    etching anistrophically the first insulation layer by using the oxidizing second conductive layer as a mask to form a pattern of an underlying electrode;
    removing said oxidized second conductive layer and said field insulation layer; and
    depositing a first insulation layer over a surface of said underlying electrode, and forming an upperlying electrode by coating an entire surface of the substrate.

12. The method of claim 11, wherein said first, second and third conductive layers are polycrystalline silicone layers, said layers being doped with conductive impurities.

13. The method of claim 11, wherein said first insulation layer is a nitride layer.

14. The method of claim 11, wherein the polycrystalline silicone layer is oxidized in a high pressure diffusion furnace for a plurality of minutes at a temperature of 850° C. in a pressure of approximately twenty-five atmospheres.

15. The method of claim 11, wherein said polycrystalline silicon layer is oxidized in a diffusion furnace.

16. The method of claim 15, wherein said polycrystalline silicon layer is oxidized for approximately 10 hours at 950° C. to 1,000° C. in an atmospheric pressure in case that oxidation operation is carried out in the diffusion furnace.

17. The method of claim 11, wherein the thickness of said first conductive layer is approximately 4000 Å.

18. The method of claim 17, wherein the thickness of said underlying electrode is approximately 1000 Å.

19. The method of claim 11, wherein said field oxide layer is a high temperature oxide insulation layer.

20. The method of claim 11, wherein said field oxide layer is replaced by a nitride layer.

* * * * *

UNITED STATES PATENT AND TRADEMARK OFFICE
CERTIFICATE OF CORRECTION

PATENT NO. : 5,104,821
DATED : 14 April 1992
INVENTOR(S) : Jin-Suk CHOI et al.

It is certified that error appears in the above-identified patent and that said Letters Patent is hereby corrected as shown below:

Claim 12, Column 6, Line 68, replace "silicone" with --silicon--.

Signed and Sealed this

First Day of June, 1993

Attest:

MICHAEL K. KIRK

Attesting Officer

Acting Commissioner of Patents and Trademarks